(12) United States Patent
Hadbi

(10) Patent No.: US 12,368,410 B2
(45) Date of Patent: Jul. 22, 2025

(54) ARCHITECTURE OF PHOTOVOLTAIC INSTALLATIONS

(71) Applicant: ELECTRICITE DE FRANCE, Paris (FR)

(72) Inventor: Djamel Hadbi, Thomery (FR)

(73) Assignee: ELECTRICITE DE FRANCE, Paris (FR)

( * ) Notice: Subject to any disclaimer, the term of this patent is extended or adjusted under 35 U.S.C. 154(b) by 50 days.

(21) Appl. No.: 17/799,498

(22) PCT Filed: Feb. 5, 2021

(86) PCT No.: PCT/EP2021/052789
§ 371 (c)(1),
(2) Date: Aug. 12, 2022

(87) PCT Pub. No.: WO2021/170371
PCT Pub. Date: Sep. 2, 2021

(65) Prior Publication Data
US 2023/0074235 A1    Mar. 9, 2023

(30) Foreign Application Priority Data
Feb. 24, 2020 (FR) .................................. 2001803

(51) Int. Cl.
*H02S 40/36* (2014.01)
*H01L 31/0725* (2012.01)
(Continued)

(52) U.S. Cl.
CPC .............. *H02S 40/36* (2014.12); *H02J 3/381* (2013.01); *H02J 2300/26* (2020.01); *H10F 10/161* (2025.01)

(58) Field of Classification Search
CPC ....... H02S 40/36; H02J 3/381; H02J 2300/26; H01L 31/0725; H01L 31/042; H01L 31/02021; Y02E 10/56
See application file for complete search history.

(56) References Cited

U.S. PATENT DOCUMENTS 8,569,613 B1   10/2013  Brown
2011/0115300 A1*  5/2011  Chiang ............. H01L 31/02021
                                                      307/82
(Continued)

OTHER PUBLICATIONS

International Search Report (with English Translation) and Written Opinion (with Machine Translation) issued on Apr. 26, 2021 in corresponding International Patent Application No. PCT/EP2021/052789; 16 pages.

*Primary Examiner* — Angelo Trivisonno
(74) *Attorney, Agent, or Firm* — Maier & Maier, PLLC

(57) ABSTRACT

A photovoltaic system including an output inverter for connection to a third-party network, and at least one string, each string including at least one module of tandem photovoltaic cells, each module having a first and a second pair of connectors. The modules of a string are connected in series via their first pair of connectors. The strings are connected to the output inverter in parallel to each other via connectors of each string among the first pairs of connectors. Several modules are connected in parallel via their second pairs of connectors so as to form a first group that is coupled, via the second pairs of connectors, upstream of the output inverter, to a second group of module(s) composed of a single module or of a series of modules connected to each other in series by their first pairs of connectors.

6 Claims, 13 Drawing Sheets

(51) Int. Cl.
*H02J 3/38* (2006.01)
*H10F 10/161* (2025.01)

(56) References Cited

U.S. PATENT DOCUMENTS

| | | | |
|---|---|---|---|
| 2013/0106194 A1* | 5/2013 | Jergovic | H02J 3/381 307/77 |
| 2013/0206219 A1* | 8/2013 | Kurtin | H01L 31/03925 136/255 |
| 2017/0040557 A1 | 2/2017 | Bailie et al. | |

* cited by examiner

ARCHITECTURE OF PHOTOVOLTAIC INSTALLATIONS

FIELD

The invention falls within the field of energy production by a set of at least one photovoltaic module.

BACKGROUND

A photovoltaic module (or panel) comprises a plurality of photovoltaic cells, for example 60 or 72 cells. Recently, a new type of photovoltaic cell has made an appearance: tandem cells. Tandem cells have a theoretical efficiency of more than 30%, in comparison to the 22% of conventional industrial PERC cells (PERC for "Passivated Emitter and Rear Cell").

Tandem cells are composed of a stack of layers of various semiconductor materials, each P-N junction forming a sub-cell and therefore exhibiting different properties. The optimal operating conditions for the conversion of energy differ according to the nature of said layers. In other words, tandem cells allow the cell as a whole to be effective over a wider variety of operating conditions, making installations more flexible in terms of weather conditions, in particular light spectrum ranges, intensity of illumination, and temperature.

When several types of P-N junctions are present, each cell can have two terminals (or electrical terminals). The sub-cells are then connected in series. Such cells can then be connected in a conventional manner to the rest of the installation, in place of conventional cells such as PERC cells. However, in practice, the efficiency of each cell is limited by the lowest current of all the junctions. In other cases, each cell may have a number of terminals equal to twice the number of junction types. For example, each cell has four independent electrical terminals (one pair per junction). As indicated in US 2017/0040557, and as with the other elements of photovoltaic installations, it is theoretically possible to associate a converter with each sub-cell. This makes it possible to decouple the operation of the sub-cells and therefore to make their efficiency independent of each other. In practice, it remains necessary to (at least) double the other components of the installation (connectors, wiring, inverters, etc.), which significantly increases the risk of malfunctions and the costs. In addition, the converters are bulky and sensitive to the heat due to solar irradiation, which in practice further reduces the relevance of such a system.

SUMMARY

This disclosure improves the situation.

A photovoltaic system is provided, comprising an output inverter for connection to a third-party network, and at least one string, each string including at least one module of tandem photovoltaic cells, each module having a first pair of connectors and a second pair of connectors, the modules of a string being connected to each other in series by means of their first pair of connectors, the strings being connected to the output inverter in parallel to each other by means of connectors of each string among the first pairs of connectors, several modules further being connected in parallel via their second pairs of connectors so as to form a first group, said first group further being coupled, via said second pairs of connectors, upstream of the output inverter, to a second group of module(s) composed of a single module or a series of modules connected to each other in series by their first pairs of connectors.

The features set forth in the following paragraphs may optionally be implemented. They may be implemented independently of each other or in combination with each other:

Each module comprises a converter. Each first pair of connectors of a module is coupled to the second pair of connectors of said module by means of said converter. The converter is controlled by means of a maximum power point tracker algorithm MPPT such that the power subtracted via the second pair of connectors is made independent of the operating conditions of the first pair of connectors.

The converter is mounted on a face of the module opposite to the operational face of the photovoltaic cells, so that the converter is protected from solar irradiation.

The first group and the second group each comprise a different number of modules, such that the ratio between these two numbers can be chosen to correspond at least approximately to the ratio of the unit operating voltage or current of each of the two sub-cells constituting the tandem photovoltaic cells.

The first group and the second group comprise the same modules. The modules of a string are assembled in series via their first pair of connectors on the one hand and via their second pairs of connectors on the other. Each string further includes a converter arranged in series or in parallel between the string formed via the first pairs of connectors and the string formed via the second pairs of connectors. Each converter is controlled by means of a maximum power point tracker algorithm MPPT such that the power subtracted via the second pair of connectors is made independent of the operating conditions of the first pair of connectors.

The converter, arranged in series or in parallel between the string formed via the first pairs of connectors and the string formed via the second pairs of connectors, is composed of two power switches.

The output inverter includes a modular multi-input inverter, said inverter being controlled by means of independent maximum power point MPP tracker algorithms on each input such that the power subtracted via the second pairs of connectors is made independent of the operating conditions of the first pairs of connectors.

BRIEF DESCRIPTION OF DRAWINGS

Other features, details, and advantages will become apparent upon reading the detailed description below, and upon analyzing the appended drawings, in which.

The drawings and the description below for the most part contain elements that are certain in nature. Therefore not only may they be used to provide a better understanding of this disclosure, but where appropriate they also contribute to its definition.

In the following, it is considered that:
a "system" refers to a photovoltaic installation as a whole, such as an electrical power plant including a plurality of photovoltaic "modules";
a "module" designates what is commonly referred to as a photovoltaic panel and includes a plurality of photovoltaic "cells" (here tandem cells; usually 60 or 72 cells per module);
a tandem "cell" designates an assembly of several "sub-cells", generally in the form of a stack of layers;
a "sub-cell" designates the combination of two layers of different materials forming a P-N junction and in which originates the physical phenomenon of electricity generation under the effect of illumination.

Physical Principles

For good performance of a photovoltaic system (typically a power station, or "solar farm"), the efficiency of the basic components is key. Tandem cells theoretically have good efficiency.

In particular, as is true for conventional (non-tandem) photovoltaic cells, the characteristics (voltage and current) of the sub-cells are different from each other. Each sub-cell, each cell, each photovoltaic module, each string, and each system has a theoretical maximum power point (or MPP) defined by the current and voltage operating conditions. This MPP varies from one element to another. The MPP depends in particular on:
the intrinsic properties of the elements, which can differ depending on the manufacturing conditions, even between two theoretically identical models, and which are deliberately different between two sub-cells of a tandem cell,
aging,
soiling,
illumination (exposed to the sun or in the shade),
temperature.

Figure 1:
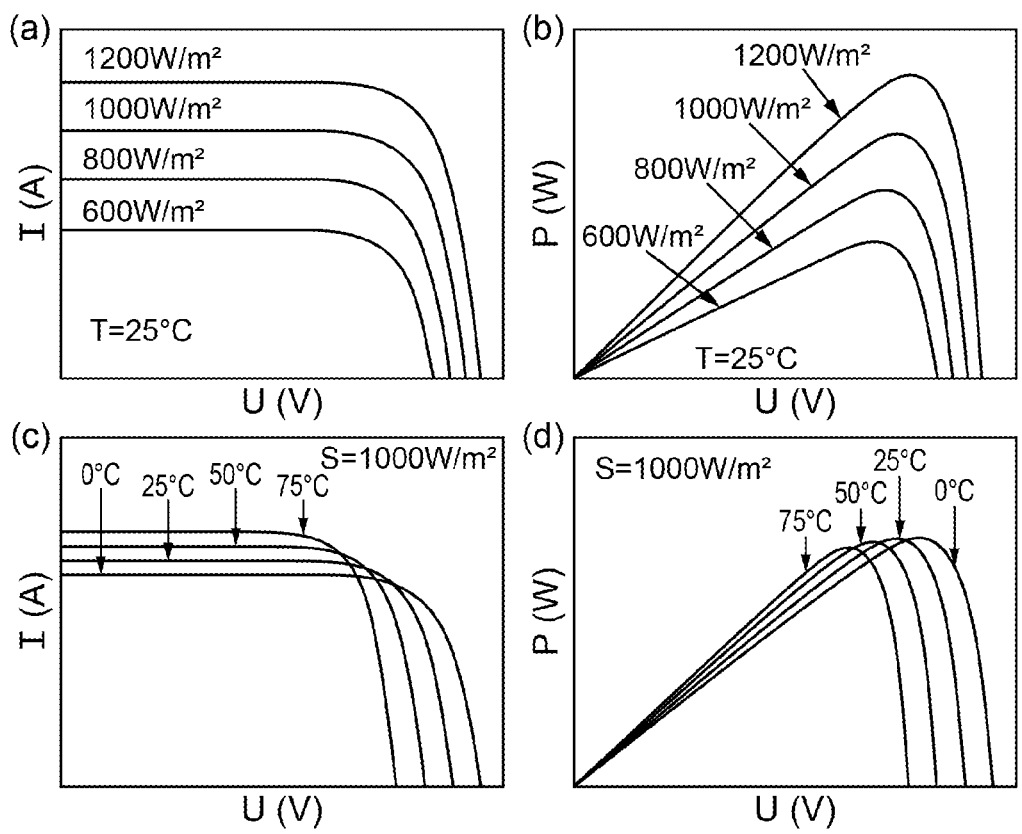
FIG. 1 illustrates the current or power characteristics as a function of the voltage of a conventional module, for different operating conditions.

Reference is now made to [FIG. 1]. As an example, it shows the dependence of the current, voltage, power, temperature and illumination characteristics of a module that is based on non-tandem cells (one P-N junction per cell). Roughly, it can be considered that light irradiation mainly influences the current produced, while in comparison there is little variation in the voltage. Conversely, temperature has more effect on voltage—the differences in current are smaller.

In conventional installations, the characteristics of certain elements are managed via inverters controlled by means of an MPPT ("Maximum Power Point Tracker") algorithm which makes it possible to be as close as possible to a maximum power point by imposing the current or voltage.

Replacing conventional cells with tandem cells in existing systems results in limiting the efficiency of each tandem cell to the lowest efficiency of the sub-cells that compose it. Similarly, this results in limiting the efficiency of each module of tandem cells to the lowest efficiency of the cells that compose it. The actual overall efficiency of the system is thereby limited. The difference between the actual efficiency and the theoretical efficiency is degraded even more when the power of the light spectrum is reduced or when the average photon energy (or APE) is low, for example less than 1.78 eV, which corresponds to the winter sunshine conditions that are frequent in mainland France.

In combination with the use of tandem cells, it is therefore preferable to make use of the energy available in each sub-cell regardless of the weather conditions, by decoupling the heterogeneous sub-cells from each other. Optimizing the immediate environment of the cells is therefore also a key to good energy performance: the entire conversion string must be adapted in order to preserve the efficiency gain made possible by tandem cells, from the P-N layers of the sub-cells to the node connecting to the transmission or distribution network.

Each element of the system has its own MPP at each moment. It is therefore possible to provide controlled converters which allow varying the operating conditions (current and voltage) of the elements with which they are associated.

In theory, it is possible for each of the elements to operate under individually controlled current and voltage conditions by equipping each element with an inverter controlled by means of an MPPT algorithm. However, the number of optimizers and the properties of optimizers suitable for high power conditions make the installation and maintenance costs prohibitive, especially for high power installations.

DETAILED DESCRIPTION

In the following, the photovoltaic cells are tandem cells, meaning they comprise a plurality of sub-cells (two sub-cells in the examples shown). Within a tandem cell, denoted 1 in the following, the two sub-cells are of different physical types, which gives them different behaviors and properties under the effect of illumination. Therefore, when operating under similar illumination, the voltage and current at the terminals of each sub-cell are generally different for each sub-cell.

Figure 2:
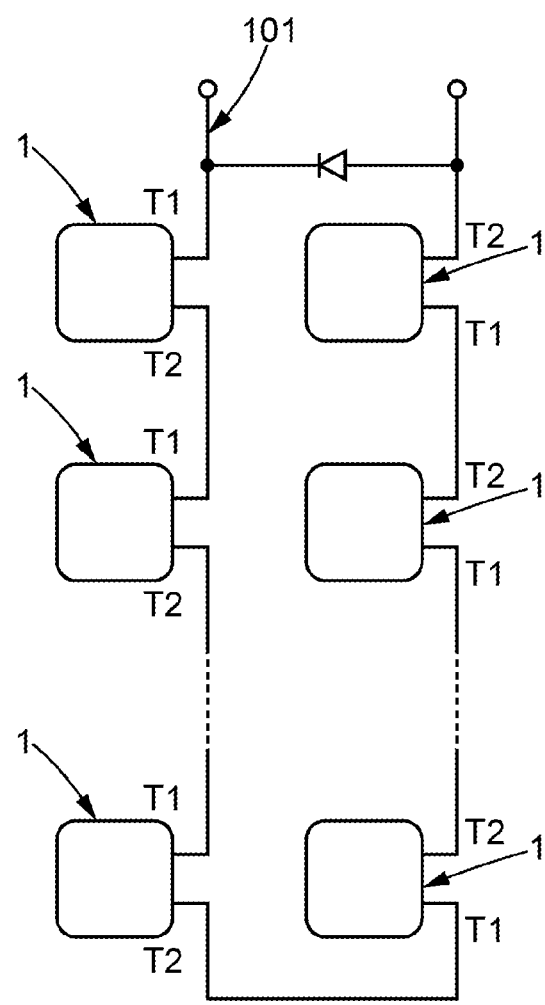
FIG. 2 shows a string of two-terminal tandem photovoltaic cells.
Figure 3:
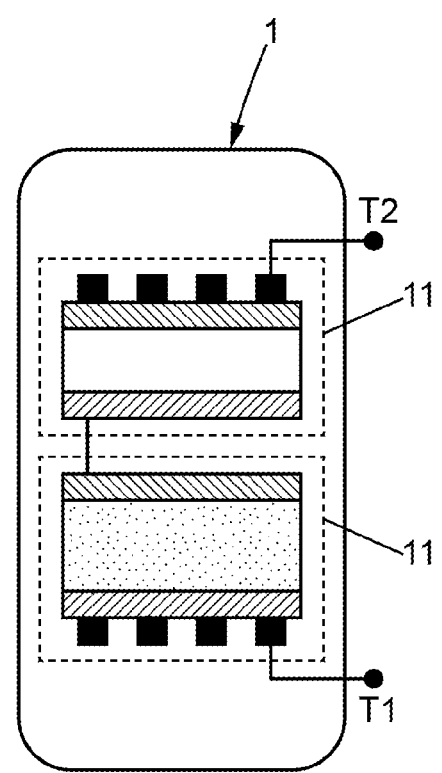
FIG. 3 shows details of a two-terminal tandem photovoltaic cell.

Reference is now made to [FIG. 2] and [FIG. 3]. A string 101 of cells 1 connected to each other in series is represented here. In this example, the sub-cells are connected in series. The cell 1 thus has only two terminals T1 and T2 (or connection terminals). In this simplified example, the single string 101 can be viewed as a module by itself. Such a module then only has two terminals T1 and T2 (at the top in [FIG. 2]). Such cells are then compatible with the existing infrastructures of modules accommodating cells with two connectors. Such modules are then compatible with the existing infrastructures of systems accommodating modules with two connectors. Simplification and backward compatibility is improved, at the cost of energy efficiency which is limited to the lower current among the two sub-cells (or among the two P-N junctions).

Each string and/or module may further comprise a diode arranged between the two terminals T1 and T2. This prevents the current from being reversed and therefore prevents the string and/or module from consuming electricity from the external network to which it is connected.

Figure 4:
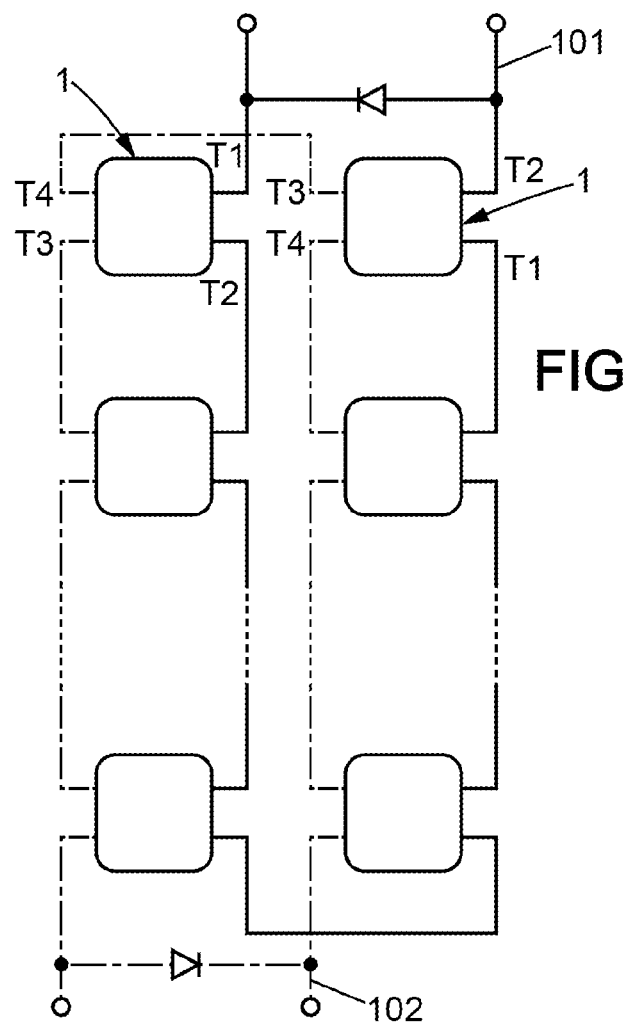
FIG. 4 shows a string of four-terminal tandem photovoltaic cells.
Figure 5:
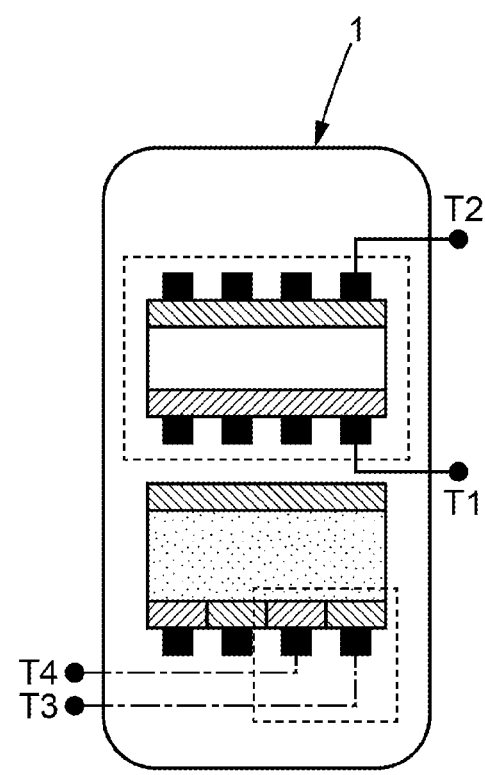
FIG. 5 shows details of a four-terminal tandem photovoltaic cell.

Reference is now made to [FIG. 4] and [FIG. 5]. The sub-cells are similar to those of [FIG. 2] and [FIG. 3]. On the other hand, the sub-cells are not connected to each other in series but remain independent of each other. The cell 1 thus has four terminals, i.e. two pairs: T1 and T2 on the one hand and T3 and T4 on the other hand. In this simplified example, a first string 101 similar to that of [FIG. 2] and [FIG. 3] corresponds to the connection in series of the cells 1 via their first pair of terminals T1 and T2. String 101 then also has two terminals T1 and T2 (at the top in [FIG. 4]). In addition, a second string 102 similar to the first corresponds to the connection in series of the cells 1 via their second pair of terminals T3 and T4. String 102 then also has two terminals T3 and T4 (at the bottom in [FIG. 4]). Although the two sub-cells are physically integral to each other within each cell 1, the currents from each of the two types of sub-cells are separated at the output from the cell 1. Two sets of connectors specific to each of the two types of sub-cells are utilized.

Electrically, each of the two outputs T1-T2 and T3-T4 of the assembly represented in [FIG. 4] can be viewed as an independent photovoltaic sub-module. It therefore becomes possible, at least in theory, to extract a maximum power for each sub-cell (each junction) according to its nature and in particular the semiconductor material used. For this purpose, independent networks (electrically isolated from each other) may be provided downstream. This implies, for the cases of tandem cells with two sub-cells, duplicating the cables, duplicating the contacts, duplicating the inverters, and duplicating the control components in comparison to existing installations with conventional cells (non-tandem). This further increases the risk of malfunction and the costs of installation as well as maintenance. Furthermore, such cells are often incompatible with the existing infrastructures of two-connector modules and systems. The theoretical efficiency, which is no longer limited by the lower current among the two sub-cells (or among the two P-N junctions), is improved at the expense of backward compatibility and reliability.

Figure 6:
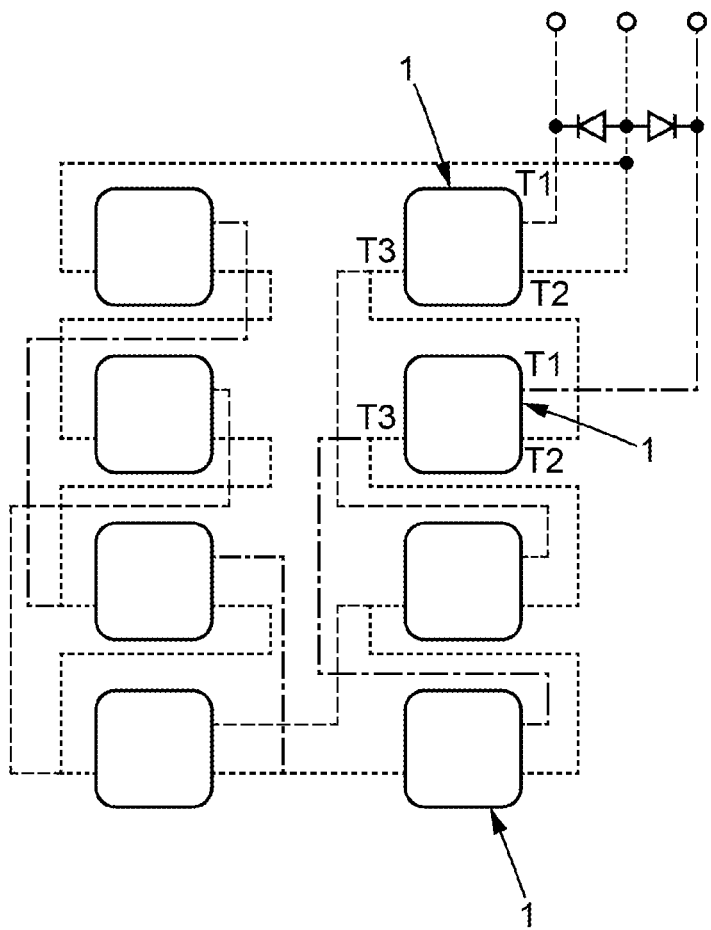
FIG. 6 shows a string of three-terminal tandem photovoltaic cells.
Figure 7:
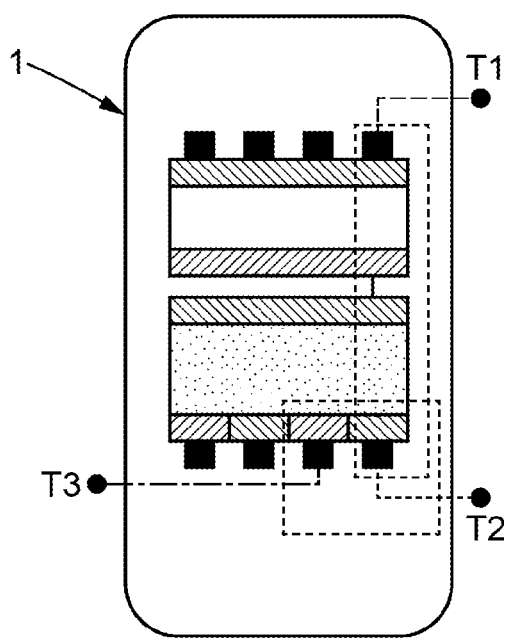
FIG. 7 shows details of a three-terminal tandem photovoltaic cell.

Reference is now made to [FIG. 6] and [FIG. 7]. This example can be viewed as a solution that is a hybrid of the previous two. By comparison with the example of [FIG. 4] and [FIG. 5], a common potential is created between the two sub-cells. A current extraction line on one of the two sub-cells is created in order to prevent equalization of the current traveling through the two sub-cells (the two junctions). This theoretically makes it possible to achieve efficiencies similar to those of the previous architecture ([FIG. 4] and [FIG. 5]) by reducing the output to only three connectors instead of four. Such an architecture is particularly suitable for silicon-based cells having an interdigitated back contact (IBC) structure, in particular because their contacts are entirely moved to one of their faces. However, such cells remain complex (and therefore expensive) to manufacture.

In the following, embodiments which allow improving the situation compared to examples of the embodiment of [FIG. 2] are described. These embodiments, in particular combined with the four-terminal (or 4T) architectures of [FIG. 4] and/or three-terminal (or 3T) architectures of [FIG. 6], allow decoupling the sub-cells from the tandem cells downstream of the cells themselves, so as to take advantage in actual practice of the good theoretical efficiency of tandem cells, while avoiding the proliferation of connections, wiring, and electrical components.

In a tandem module, the performances of each junction differ because of the different characteristics of the semiconductor materials. Moreover, these physical characteristics (such as bandgap energy or temperature coefficients) evolve differently relative to the solar irradiation and temperature.

Figure 8:
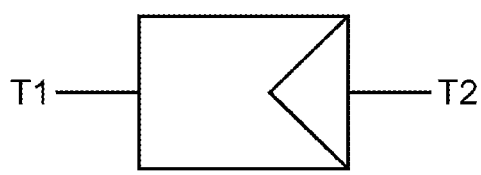
FIG. 8 represents a two-terminal photovoltaic module.
Figure 9:
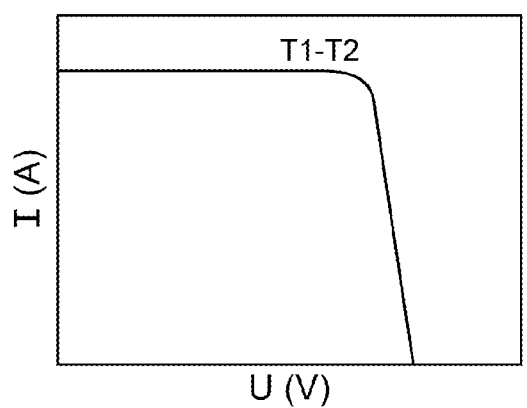
FIG. 9 illustrates characteristics of the current as a function of the voltage of the module of the preceding figure.
Figure 10:
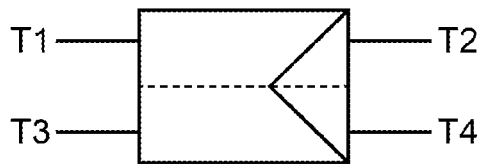
FIG. 10 represents a four-terminal photovoltaic module.
Figure 11:
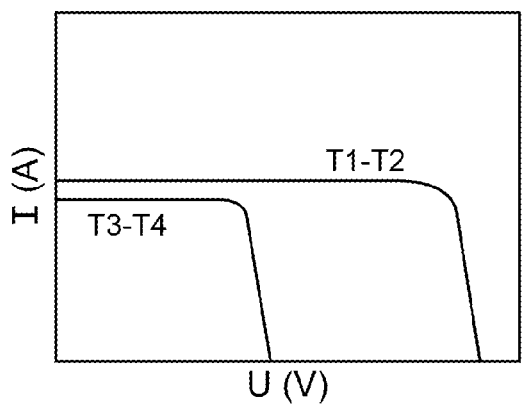
FIG. 11 illustrates characteristics of the current as a function of the voltage of the module of the preceding figure.

Reference is now made to [FIG. 8], [FIG. 9], [FIG. 10], and [FIG. 11]. [FIG. 8] illustrates a two-terminal module with terminals T1 and T2 while [FIG. 9] illustrates the characteristic curve of the two-terminal module with terminals T1 and T2. The "wider" the curve (constant current for a wide range of voltages), the greater the power developed by a module. [FIG. 10] illustrates a four-terminal module with terminals T1 to T4 while [FIG. 11] illustrates the characteristics of the four-terminal module with terminals T1 to T4. The current-voltage characteristic curve of the two-terminal module with terminals T1-T2 is unique, while each pair T1-T2 and T3-T4 of the four-terminal module has its own current-voltage characteristic curve which depends on the architecture of the modules (bandgap energy and intermediate transmission) but also on the climatic conditions undergone by the module (temperature and light irradiation).

Figure 12:
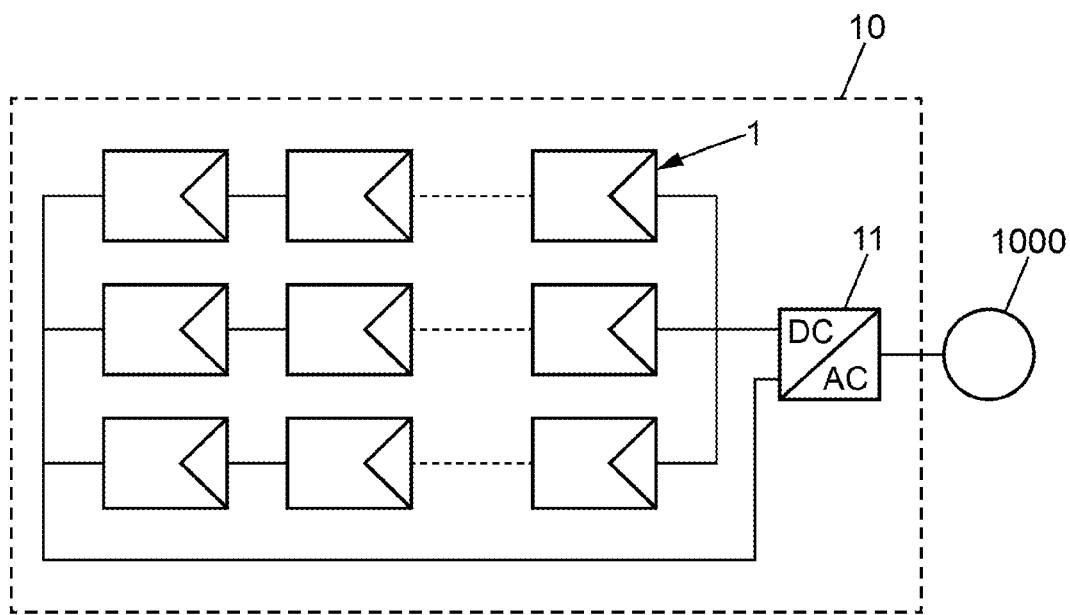
FIG. 12 represents a photovoltaic system with two-terminal modules.

Reference is now made to [FIG. 12]. [FIG. 12] represents a photovoltaic system 10. The system 10 comprises an output inverter 11. The output of the system 10 is connected to a third-party network 1000 via the output inverter 11. The system 10 further comprises a plurality of strings each bearing an index i, i being a positive integer ranging from 1 to I where I is the number of strings. Each string includes a plurality of modules 1 of tandem photovoltaic cells. Each module $1_{i,j}$ bears the index i of the string to which it belongs and an index j identifying it within the string, j being a positive integer ranging from 1 to J where J is the number of modules 1 of the string.

In an installation with modules 1 having a single pair of connectors T1-T2 (for example as shown in [FIG. 2], [FIG. 3], [FIG. 8], and [FIG. 9]), the modules are connected in series in order to reach a voltage level usable by medium-power converters, for example between 800 V and 1,500 V. The strings are connected in parallel to each other in order to add their currents and achieve a high level of power. The simplest architecture comprises a single output inverter 11 to which all the strings of modules are connected. The output of the output inverter 11 is connected to the third-party network 1000. Such an architecture is particularly suitable for power plants of very high power because it is particularly reliable and economical: a single converter is sufficient and inexpensive compared to the amount of energy supplied to the third-party network 1000. A set of sensors and a distributed control and monitoring subsystem is sufficient.

Figure 13:
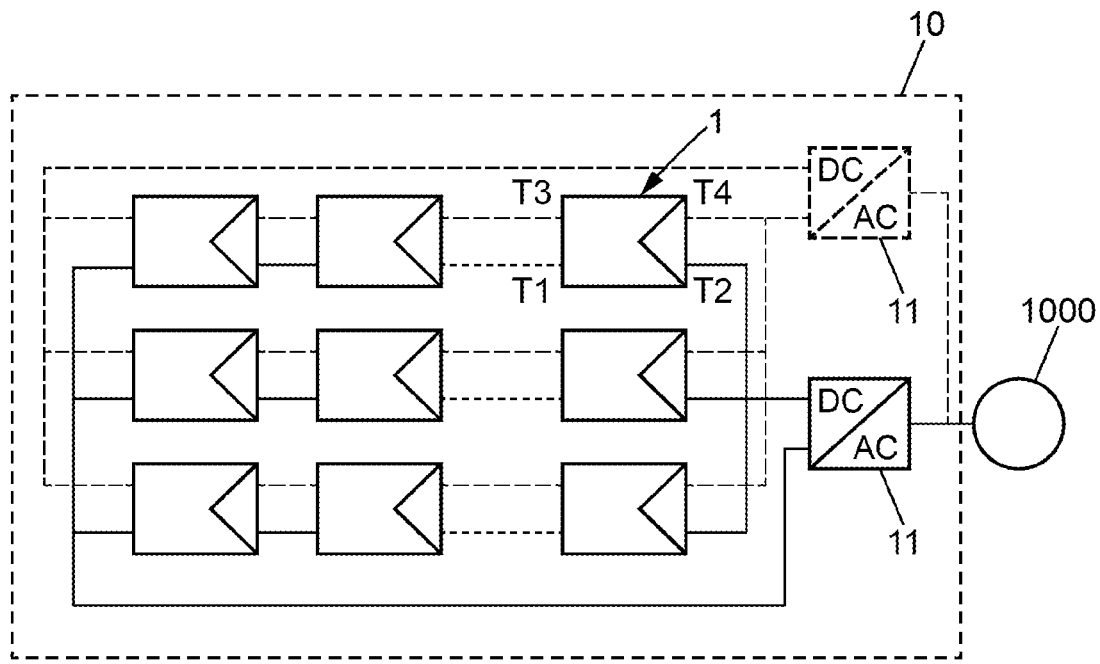
FIG. 13 represents a photovoltaic system with four-terminal modules (duplicate connectors, cables, and inverter).

Reference is now made to [FIG. 13]. Each module $1_{i,j}$ has a first pair of connectors $T1_{i,j}$, $T2_{i,j}$ and a second pair of connectors $T3_{i,j}$, $T4_{i,j}$, the indices corresponding to those of the module $1_{i,j}$. The modules $1_{i,j}$ are connected via their first pair of connectors $T1_{i,j}$, $T2_{i,j}$ in the same manner as described above for [FIG. 12]. The modules $1_{i,j}$ are also connected via their second pair of connectors $T3_{i,j}$, $T4_{i,j}$ in the same manner as described above for [FIG. 12], but by means of separate wiring than was used for the first pairs of connectors $T1_{i,j}$, $T2_{i,j}$. Similarly, a second output inverter 11 is arranged between the second wiring and the third-party network 1000.

Such an architecture is therefore obtained by duplicating the connection and conversion equipment. Although the modules are based on tandem cells, each pair of terminals behaves as an independent module: terminals of the same type are connected in series in order to reach a usable voltage level (for example between 800 V and 1500 V), particularly if the desire is to use the same type of inverter for both networks. Alternatively, the two types of terminals may correspond to different voltages. Different output inverters may then be utilized.

In such an architecture, the two networks are duplicated, which doubles the complexity, the risk of failure, and the cost in equipment, installation, and maintenance, compared to the architecture of [FIG. 12].

A Embodiments

Figure 14:
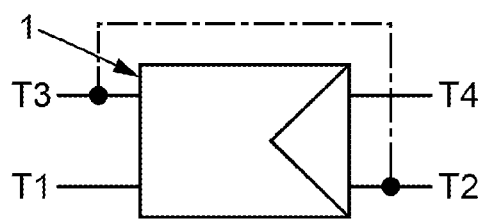
FIG. 14 represents a four-terminal photovoltaic module whose outputs are connected in series.
Figure 15:
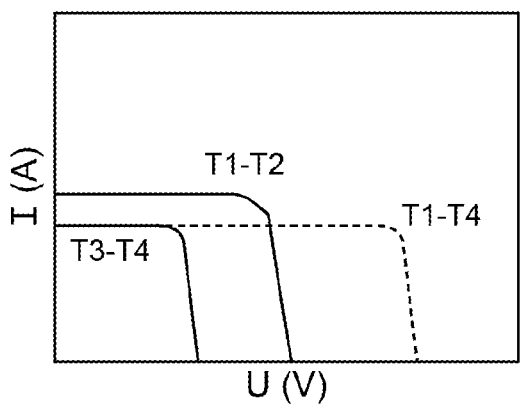
FIG. 15 illustrates characteristics of the current as a function of the voltage of the module of the preceding figure.

Reference is now made to [FIG. 14] and [FIG. 15]. The terminals T2 and T3 are connected together so that the module is changed from four terminals to two terminals (connected in series). As shown in [FIG. 15], connecting the outputs in series means that the current flowing through the two outputs is limited to the lowest current. The resulting characteristic curve is less than the sum of the characteristic curves of the two independent outputs (T1-T2 and T3-T4). In addition, when the current of the T3-T4 characteristic curve decreases (due to underperformance, in particular due to a decrease in illumination), the resulting T1-T4 characteristic curve is pulled down as well.

Figure 16:
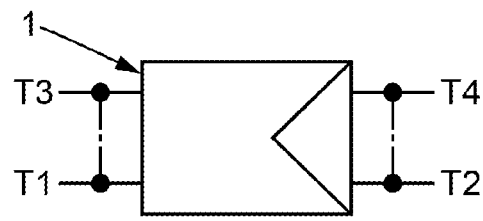
FIG. 16 represents a four-terminal photovoltaic module whose outputs are connected in parallel.
Figure 17:
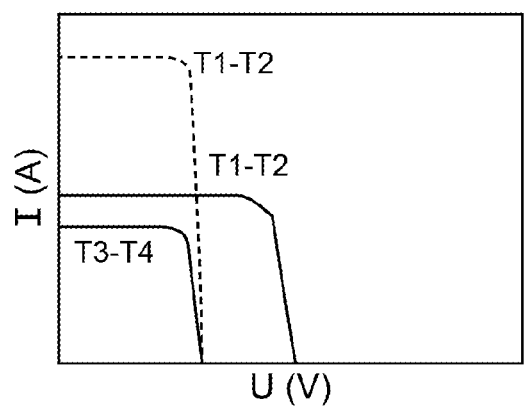
FIG. 17 illustrates characteristics of the current as a function of the voltage of the module of the preceding figure.

Reference is now made to [FIG. 16] and [FIG. 17]. Terminals T2 and T4 are connected to each other so as to be at equipotential, and terminals T1 and T3 are also connected to each other for the same reason, the module being changed from four terminals to two terminals (parallel connection). As shown in [FIG. 17], the parallel connection means that the resulting characteristic curve is less than the sum of the characteristic curves of the two independent outputs. Moreover, as soon as the T3-T4 characteristic curve is pulled to the left, i.e. a current maintained for a reduced range of voltages (due to underperformance, in particular due to an increase in temperature), the resulting characteristic curve will also be pulled to the left.

Figure 18:
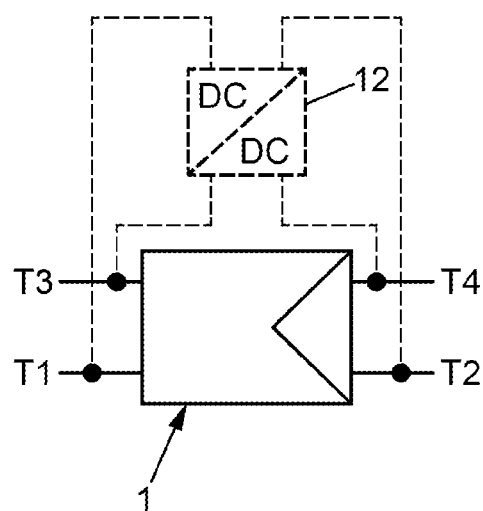
FIG. 18 represents a four-terminal photovoltaic module whose outputs are coupled according to an example of an embodiment A.
Figure 19:
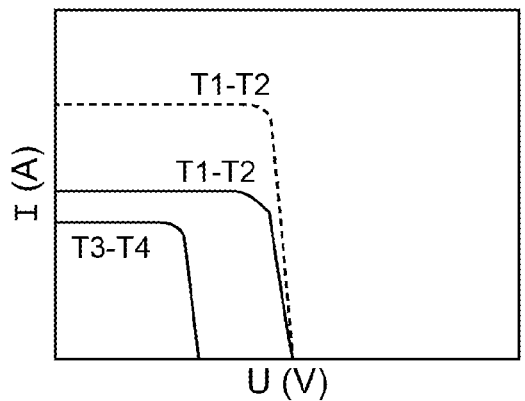
FIG. 19 illustrates characteristics of the current as a function of the voltage of the module of the preceding figure.

Reference is now made to [FIG. 18] and [FIG. 19]. A DC to DC (direct current to direct current) converter 12 is arranged between the first pair of connectors T1-T2 and the second pair of connectors T3-T4. The converter 12 may be, for example, a simple "boost" converter (or parallel DC to DC converter). It may in particular be composed of two semiconductor switches: a transistor and a diode. Control of the converter 12 may include the implementation of an MPPT algorithm to optimize the power subtracted from the second pair of connectors T3-T4 independently of the operating point of the first pair of connectors T1-T2. Thus, by means of the converter 12, electrical decoupling of the two tandem outputs is ensured and the output characteristic curve of the tandem module is wider.

Structurally, the converter 12 may be integrated into the tandem module, such that the output from the module downstream of the converter 12 is equivalent to a module with two connectors, which makes it possible to adapt such a module to existing conventional architectures.

Such a solution allows continuous optimization of the power produced, regardless of the operating conditions (solar irradiation and temperature). It requires one converter 12 per module (and not one per cell). In comparison to modules in which each cell is equipped with a converter, the cost and the risk of failure are drastically reduced: one converter per module is sufficient instead of the 60 or 72 in known modules.

Preferably, the converter 12 is arranged on the back of the module (on the side of the module not exposed to the sun). By being protected from direct sunlight and high temperatures, the risk of the converter overheating is reduced.

B Embodiments

Figure 20:
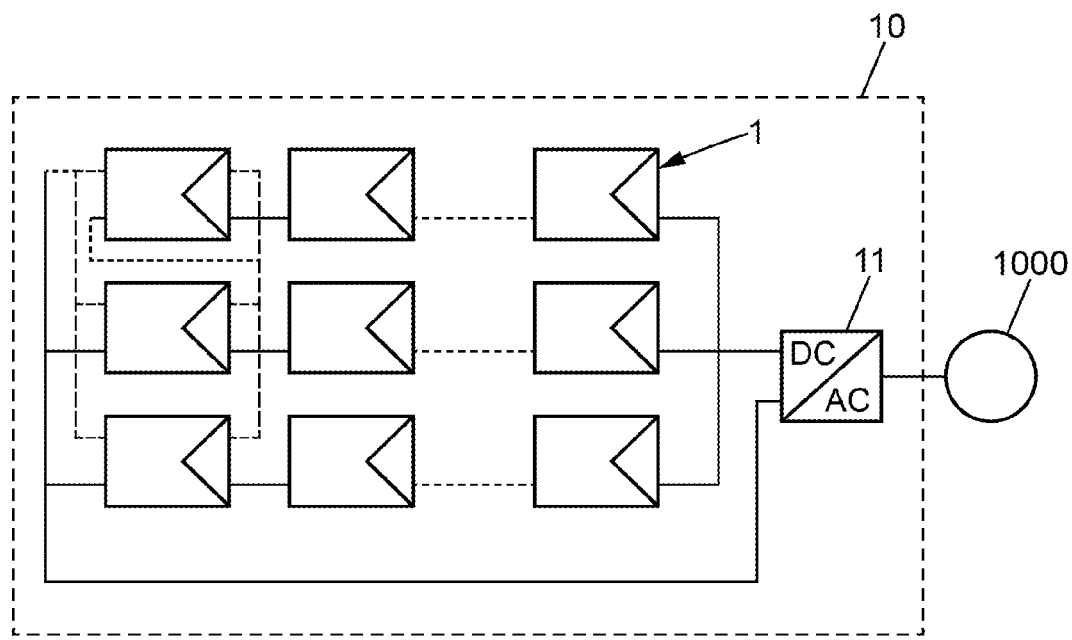
FIG. 20 represents a photovoltaic system with four-terminal modules whose outputs are coupled according to an example of an embodiment B.

Reference is now made to [FIG. 20] corresponding to embodiment B.

In embodiment B, a plurality of modules 1 are connected in parallel via their second pair T3-T4 to achieve a range of current equivalent to that of a single module 1 via its first pair T1-T2. To avoid an overly complex figure, a single parallel connection is shown in [FIG. 20]. In practice, several parallel connections are applied to the system 10. To determine the number of modules to be connected in parallel via the second pair of connectors T3-T4, the ratio b of currents between the two pairs is calculated ($I_{T1-T2}/I_{T3-T4}$=b), b being the integer number (rounded) of modules 1 to be connected in parallel. In [FIG. 20], an example is shown with b=3.

Embodiment B and its variants make it possible, at a relatively low cost (connection and cables), to connect pairs of connectors having different characteristics. The operating point remains limited by the lowest voltage, which limits the production from each pair, in particular when the operating point changes due to a change in solar irradiation or temperature.

C Embodiments

Figure 21:
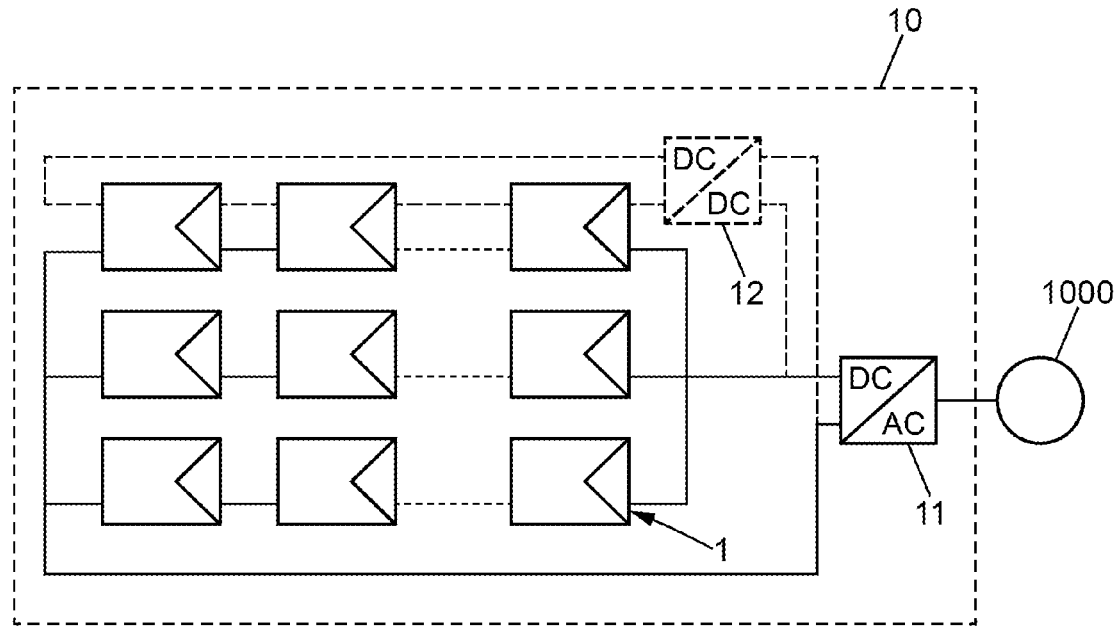
FIG. 21 represents a photovoltaic system with four-terminal modules whose outputs are coupled according to an example of an embodiment C1.
Figure 22:
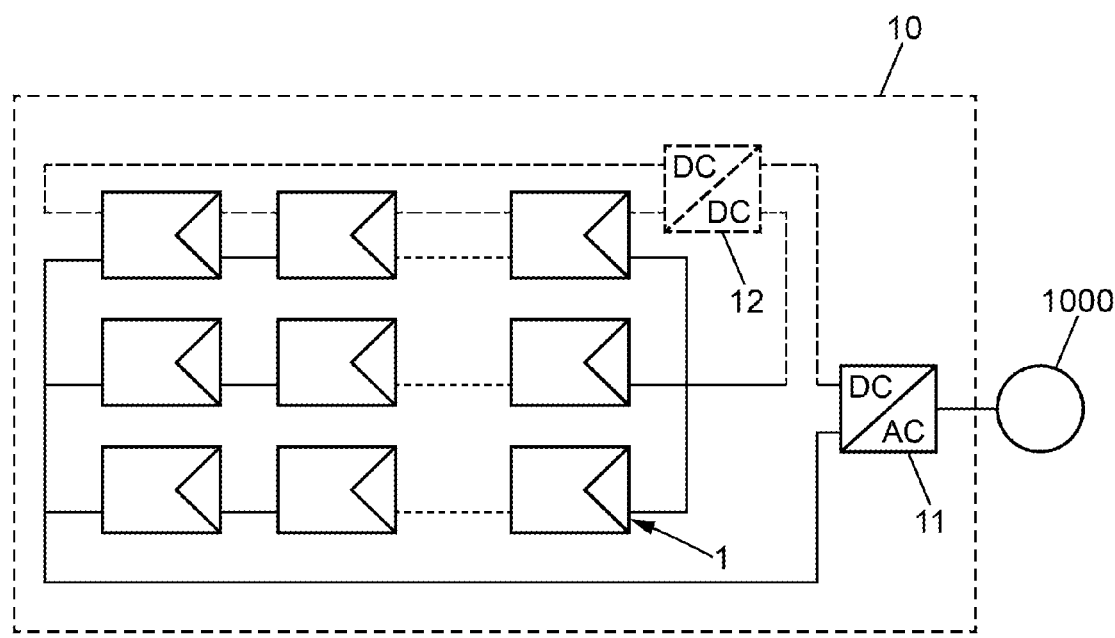
FIG. 22 represents a photovoltaic system with four-terminal modules whose outputs are coupled according to an example of an embodiment C2.

Reference is now made to [FIG. 21] and [FIG. 22] which respectively correspond to embodiments C1 and C2. In these two embodiments, the converters 12 are shared in comparison to embodiment A. The second pairs of connectors T3-T4 are each connected in groups to a first pair of connectors T1-T2 by means of a common converter 12. This is relevant because the tandem outputs of a same string are generally experiencing the same operating conditions. For modules of a same type, the characteristics when they leave the factory are very similar and remain so during their useful life. It is therefore reasonable to consider that their MPP is similar during operation.

In embodiment C1 ([FIG. 21]), the second connectors T3-T4 are connected in parallel with the first connectors T1-T2 to the main bus via the converter 12. The second connectors T3-T4 form a secondary bus while the first connectors T1-T2 form the main bus. The two buses are connected to each other in parallel, each via the output inverter 11. In embodiment C2 ([FIG. 22]), the second connectors T3-T4 are connected in series with the first connectors T1-T2 to the main bus by means of converter 12. The two buses are connected to each other in series, each via the output inverter 11 and the converter 12.

A combination of embodiments B and C can achieve a good trade-off in cost versus complexity. For example, embodiments C1 or C2 (converters shared across several modules) make it possible to smooth, at the output, any remaining differences.

D Embodiments

Figure 23:
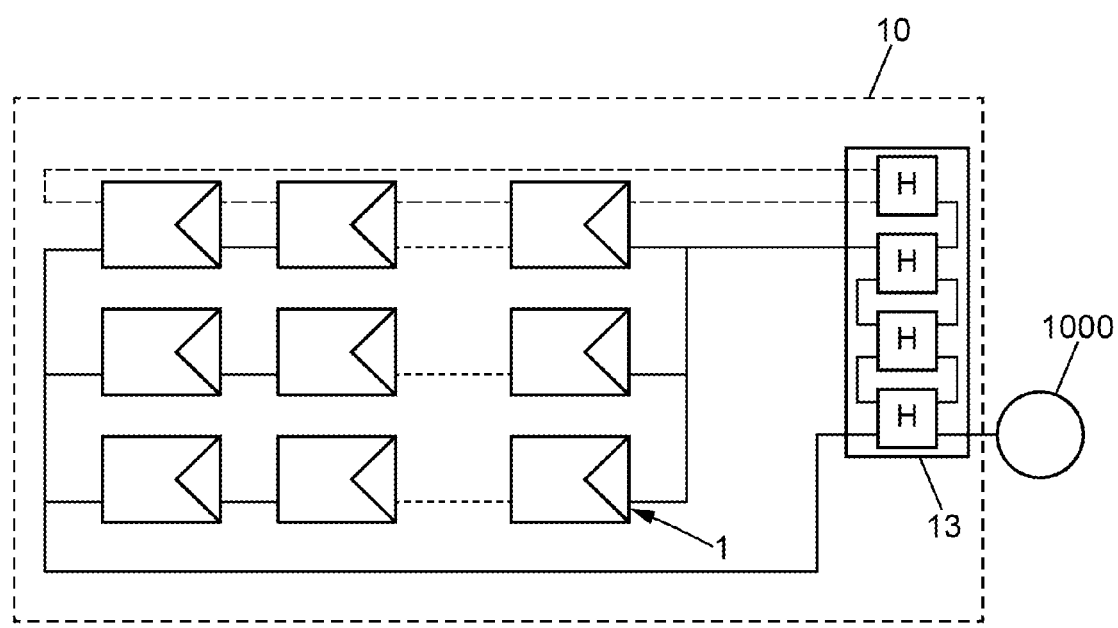
FIG. 23 represents a photovoltaic system with four-terminal modules whose outputs are coupled according to an example of an embodiment D.

Reference is now made to [FIG. 23], corresponding to embodiment D. In this embodiment, the converter 13 is distinctive. The converter 13 includes a modular central inverter of the CHB or MMC type (CHB for "Cascaded H Bridge" and MMC for "Multilevel Modular Converter"). The converter 13 makes it possible to connect second pairs T3-T4 (connected in series and/or in parallel) directly at one or more sub-modules. The optimization function of the second pairs T3-T4 can then be integrated into the controller of the converter 13, here forming a central inverter. The modular central inverter then also implements the decoupling function between the first and second pairs T1-T2 and T3-T4 which have different characteristics. No additional DC to DC converter is required.

INDUSTRIAL APPLICATIONS

The A embodiments are applicable to all photovoltaic installations. A four-connector module according to the A embodiment behaves like a conventional module, with better efficiency. It can therefore be used in small domestic installations, on the roofs of buildings, and in photovoltaic power plants. This solution can therefore be applied to new installations as well as to the renovation of existing installations.

The B and C embodiments are applicable to all photovoltaic installations having at least one string of modules.

The D embodiment is particularly suitable for large-scale installations and advantageously can replace existing solutions based on "string" or "central" type inverters.

This disclosure is not limited to the exemplary systems described above solely by way of example, but encompasses all variants conceivable to those skilled in the art within the framework of the protection sought. In particular, the different embodiments can be combined with each other, in particular at different levels of the systems (cells, sub-modules, modules, strings, bus, system).

The invention claimed is:

1. A photovoltaic system comprising:
    an output inverter for connection to a third-party network; and
    a plurality of strings, each string including a plurality of modules of tandem photovoltaic cells, each module having a first pair of connectors and a second pair of connectors, the plurality of modules of each string being connected to each other in series by means of their first pair of connectors, each string being connected to the output inverter in parallel to each other by means of connectors of each string among the first pairs of connectors, several modules further being connected in parallel via their second pairs of connectors so as to form a first group, said first group further being coupled, via said second pairs of connectors, upstream of the output inverter, to a second group of a plurality of modules composed of a single module or of a series of modules connected to each other in series by their first pairs of connectors, wherein the first group and the second group each comprise a different number of modules, such that the number of modules forming the first group is chosen to obtain the following relationship:
    IT1-T2/IT3-T4=b, where b is the number of modules forming the first group, IT1-T2 is an operating current of the second group of modules via their first pair of connectors and IT3-T4 is an operating current of each module of the first group of modules via their second pair of connectors, and the first group of modules and the second group of modules are directly connected without using a DC/DC converter.

2. The system according to claim 1, wherein each module comprises a converter, each first pair of connectors of each module is coupled to the second pair of connectors of each module by means of said converter, said converter being controlled by means of a maximum power point tracker algorithm (MPPT) such that power subtracted via the second pair of connectors is made independent of operating conditions of the first pair of connectors.

3. The system according to claim 1, wherein the converter is mounted on a face of one module opposite to the operational face of the photovoltaic cells, so that the converter is protected from solar irradiation.

4. The system according to claim 1, wherein the first group and the second group comprise the same one or the same plurality of modules, the one or the plurality of modules of a string being assembled in series via their first pair of connectors and via their second pairs of connectors, each string further including a converter arranged in series or in parallel between a string formed via the first pairs of connectors and a string formed via the second pairs of connectors, each converter being controlled by means of a maximum power point tracker algorithm (MPPT) such that power subtracted via the second pair of connectors is made independent of the operating conditions of the first pair of connectors.

5. The system according to claim 4, wherein said converter, arranged in series or in parallel between the string formed via the first pairs of connectors and the string formed via the second pairs of connectors, is composed of two power switches.

6. The system according to claim 1, wherein the output inverter includes a modular multi-input inverter, said inverter being controlled by means of independent maximum power point (MPP) tracker algorithms on each input such that power subtracted via the second pairs of connectors is made independent of operating conditions of the first pairs of connectors.

* * * * *